(12) United States Patent
Chang et al.

(10) Patent No.: US 11,854,798 B2
(45) Date of Patent: *Dec. 26, 2023

(54) SEMICONDUCTOR DEVICE AND METHOD

(71) Applicant: Taiwan Semiconductor Manufacturing Co., Ltd., Hsinchu (TW)

(72) Inventors: Ching-Yu Chang, Taipei (TW); Jei Ming Chen, Tainan (TW); Tze-Liang Lee, Hsinchu (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

This patent is subject to a terminal disclaimer.

(21) Appl. No.: 17/874,614

(22) Filed: Jul. 27, 2022

(65) Prior Publication Data

US 2022/0367179 A1  Nov. 17, 2022

Related U.S. Application Data

(63) Continuation of application No. 16/916,499, filed on Jun. 30, 2020, now Pat. No. 11,482,411.

(51) Int. Cl.
| | |
|---|---|
| *H01L 21/02* | (2006.01) |
| *H01L 21/768* | (2006.01) |
| *H01L 21/308* | (2006.01) |
| *H01L 21/3065* | (2006.01) |

(52) U.S. Cl.
CPC ...... *H01L 21/02274* (2013.01); *H01L 21/308* (2013.01); *H01L 21/3065* (2013.01); *H01L 21/76802* (2013.01)

(58) Field of Classification Search
None
See application file for complete search history.

(56) References Cited

U.S. PATENT DOCUMENTS

| | | | |
|---|---|---|---|
| 9,892,917 B2 | 2/2018 | Swaminathan et al. | |
| 10,361,112 B2 | 7/2019 | Tsai et al. | |
| 11,482,411 B2 * | 10/2022 | Chang | H01L 21/0234 |
| 2010/0197107 A1 * | 8/2010 | Matsuzaki | H01L 21/0337 |
| | | | 257/E21.546 |
| 2012/0052683 A1 | 3/2012 | Kim et al. | |
| 2017/0053799 A1 | 2/2017 | van Schravendijk et al. | |
| 2018/0138040 A1 | 5/2018 | LaVoie | |
| 2020/0135462 A1 | 4/2020 | Chang et al. | |

FOREIGN PATENT DOCUMENTS

| | | |
|---|---|---|
| CN | 109216263 A | 1/2019 |
| CN | 111128862 A | 5/2020 |

* cited by examiner

*Primary Examiner* — Roberts P Culbert
(74) *Attorney, Agent, or Firm* — Slater Matsil, LLP

(57) ABSTRACT

A method of forming a semiconductor device includes forming a mask layer over a substrate and forming an opening in the mask layer. A gap-filling material is deposited in the opening. A plasma treatment is performed on the gap-filling material. The height of the gap-filling material is reduced. The mask layer is removed. The substrate is patterned using the gap-filling material as a mask.

20 Claims, 18 Drawing Sheets

SEMICONDUCTOR DEVICE AND METHOD

PRIORITY CLAIM AND CROSS-REFERENCE

This application is a continuation of U.S. patent application Ser. No. 16/916,499, filed Jun. 30, 2020, which application is hereby incorporated herein by reference.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

Multi-patterning is a technique used in the photolithographic process that defines the features of integrated circuits at advanced process nodes. It enables designers to develop integrated circuits for manufacture on sub-20 nm process nodes using current optical lithography systems. Multi-patterning may be necessary for 10 nm and 7 nm node semiconductor processes and beyond. In multi-patterning a single photolithographic exposure may not be enough to provide sufficient resolution. Hence additional exposures are needed, or else positioning patterns using etched feature sidewalls (using spacers) are necessary to provide the desired resolution.

Atomic layer deposition (ALD) is a thin-film deposition technique based on the sequential use of a gas phase chemical process. ALD is a subclass of chemical vapor deposition. The majority of ALD reactions use two chemicals, typically called precursors. These precursors react with the surface of a material one at a time in a sequential, self-limiting, manner. Through the repeated exposure to separate precursors, a thin film is slowly deposited. ALD is used in the fabrication of increased density semiconductor devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
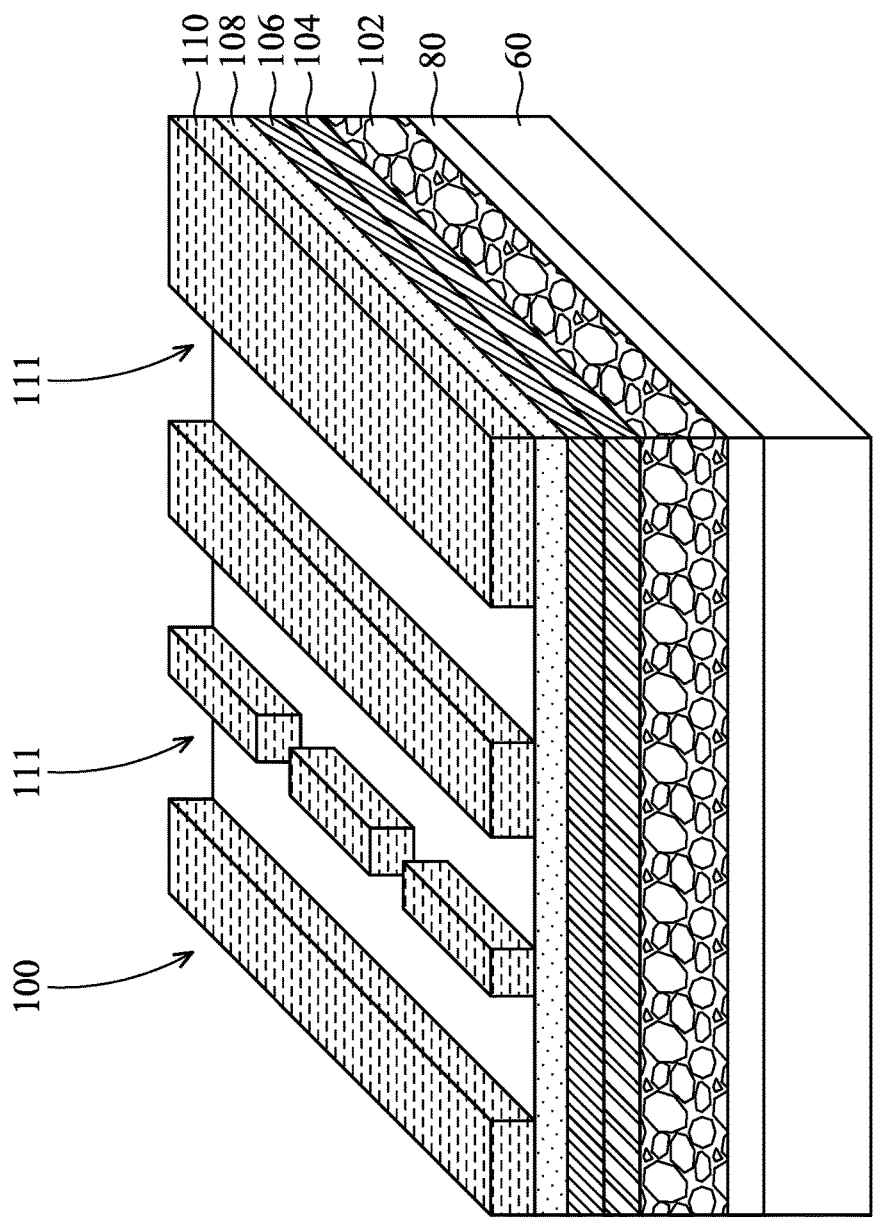
FIGS. 1, 2, and 3A illustrate perspective views of a hard mask at various initial stages of fabrication, in accordance with some embodiments.
Figure 1:
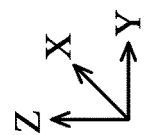

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosure are discussed in the context of forming a semiconductor device, and in particular, in the context of improving etch selectivity of a hard mask during device fabrication. Forming a single material with a plasma treatment or forming two materials with a high etch selectivity between them in a high aspect ratio trench or opening may be useful for achieving smaller and smaller features without defects such as, e.g. reducing end-to-end distances between conductive lines (e.g., the cut metal distance) in metallization layers, which may increase the overall process window of the manufacturing process. Using atomic layer deposition (ALD) to form hard mask features one layer at a time may be useful in preserving CDs of the hard mask features in the y direction by maintaining a high aspect ratio of the hard mask features.

Figure 2:
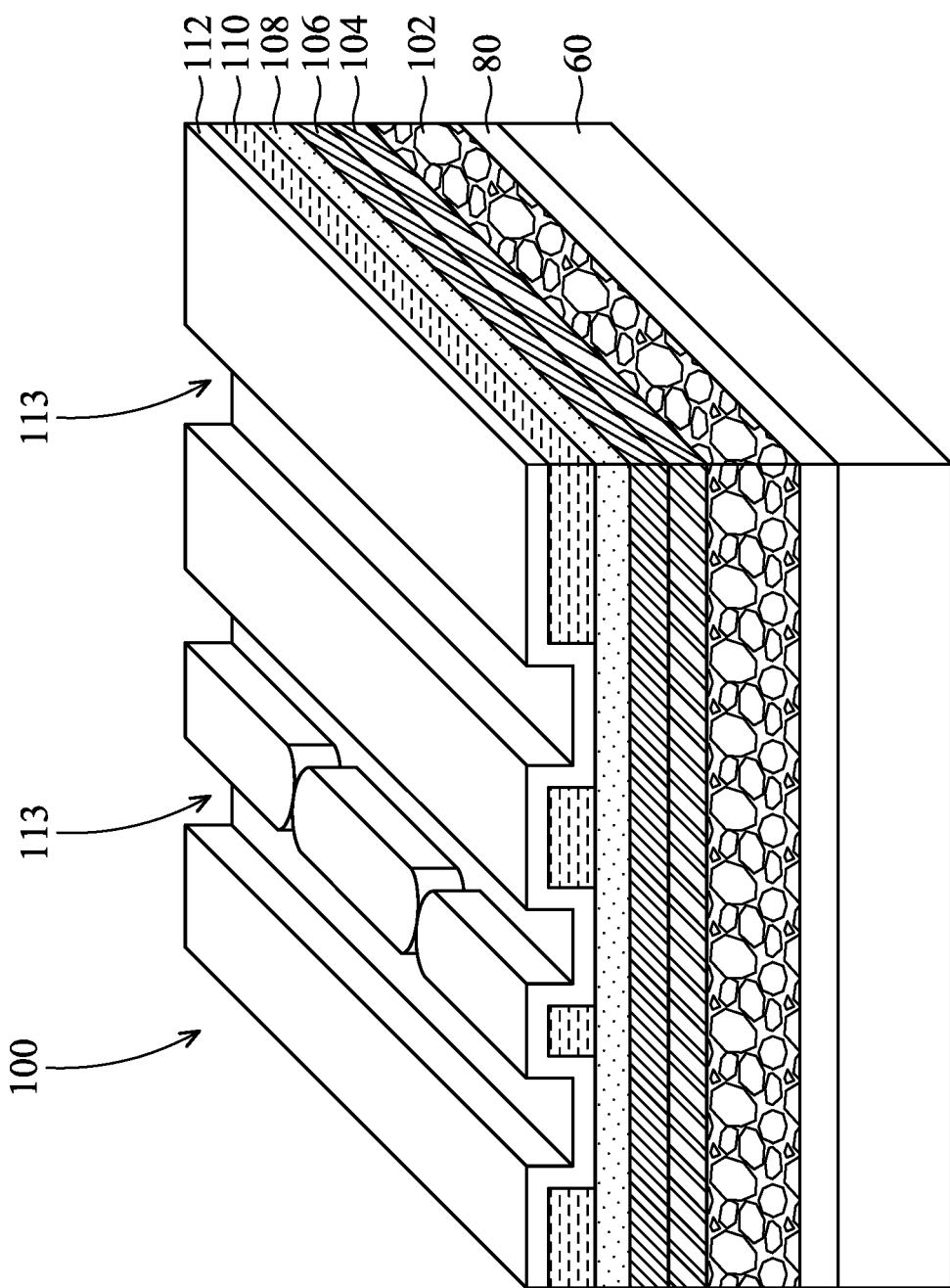

FIGS. 1-3 illustrate perspective views of a hard mask fabrication process at various initial stages of fabrication, in accordance with an embodiment, oriented with respect to a first (x-axis) direction, a second (y-axis) direction, and a third (z-axis) direction.

FIG. 1 illustrates an example of a semiconductor structure 100 including dielectrics, photomasks, and other layers described below disposed over a substrate 60 and a layer to be patterned 80. The substrate 60 may be a semiconductor substrate, such as a bulk semiconductor, a semiconductor-on-insulator (SOI) substrate, or the like, which may be doped (e.g., with a p-type or an n-type dopant) or undoped. The substrate 60 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 60 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The semiconductor substrate may further comprise an active layer (or device region) may include additional semiconductor, metal, and insulating or dielectric layers to form active devices such as transistors including Fin Field-Effect Transistors (FinFETs) as well as passive devices such as resistors and capacitors. The active layer (or device region) may further include conductive features such as contacts (also referred to as contact plugs), e.g., gate contacts and source/drain contacts, that are electrically coupled to the gates and the source/drain regions, respectively, of underlying transistors, including FinFETs.

The layer to be patterned 80 may be a dielectric layer for a metallization layer, may be a layer of semiconductor material, and may be an upper layer of a metallization layer already formed with conductive material, or may even be another masking layer that will be utilized to pattern yet another underlying layer. In some embodiments in which the layer to be patterned 80 is a dielectric layer for a metallization layer, the dielectric layer may be a dielectric material with a dielectric constant between about 1 to about 40. In particular examples the dielectric layer for the layer to be patterned 80 may be silicon oxide, silicon nitride, aluminum oxide, hafnium oxide, lanthanum oxide, other suitable low-k dielectric layers, combinations of these, or the like, formed using such processes as deposition, oxidation, or the like.

In yet another embodiment in which the layer to be patterned 80 is a metallization layer, the layer to be patterned 80 may already be formed with a conductive material using processes such as damascene, dual damascene, deposition and patterning, etc. In a particular embodiment the conductive material for the layer to be patterned 80 comprises at least one metal, metal alloy, metal nitride, metal sulfide, metal selenide, metal oxide, or metal silicide. Particular examples include copper, titanium, aluminum, cobalt, ruthenium, titanium nitride, tungsten nitride ($WN_2$), and tantalum nitride, although any suitable material may alternatively be utilized.

In some embodiments in which the layer to be patterned 80 is a semiconductor material, the layer to be patterned 80 may be a semiconductor substrate with or without intervening active devices, metallization layers, and dielectric material. However, as one of ordinary skill in the art will recognize, while materials, processes, and other details are described in the embodiments, these details are merely intended to be illustrative of embodiments, and are not intended to be limiting in any fashion. Rather, any suitable layer, made of any suitable material, by any suitable process, and any suitable thickness, may alternatively be used. All such layers are fully intended to be included within the scope of the embodiments.

As shown in FIG. 1, the semiconductor structure 100 may also include a plurality of dielectric layers, including a first dielectric layer 102, a second dielectric layer 104, a third dielectric layer 106, and a fourth dielectric layer 108. In some embodiments the first dielectric layer 102 may be made of one or more suitable dielectric materials such as low-k dielectrics such as SiOCH, other carbon doped oxides, extremely low-k dielectrics such as porous carbon doped silicon dioxide, silicon oxide, silicon nitride, a polymer such as polyimide, combinations of these, or the like. The first dielectric layer 102 may be formed through a process such as a spin-on process or a chemical vapor deposition (CVD), although any suitable process may be utilized, and may have a thickness of between about 10 nm and about 50 nm.

In some embodiments the second dielectric layer 104 may be an anti-reflective coating (ARC) formed over the first dielectric layer 102. In some embodiments the second dielectric layer 104 may be a nitrogen-free anti-reflective coating such as $SiO_x$ or $SiO_xC_y$, polymer based dielectrics, combinations of these, or the like. The second dielectric layer 104 may be formed using chemical vapor deposition, physical vapor deposition, atomic layer deposition, spin-coating, dip coating, or the like.

Once the second dielectric layer 104 has been formed, the third dielectric layer 106 may be formed over the second dielectric layer 104 to act as a hard mask. In some embodiments the third dielectric layer 106 may be a masking material such as titanium nitride (TiN), although any other suitable material, such as titanium oxide may be used. The third dielectric layer 106 may be formed using a deposition process such as chemical vapor deposition, physical vapor deposition, atomic layer deposition, combinations of these, or the like, and may be formed to a thickness of between about 10 nm and about 35 nm. However, any suitable thickness may be utilized.

The fourth dielectric layer 108 may be formed over the third dielectric layer 106 as another hard mask. In some embodiments the fourth dielectric layer 108 may be, e.g., an oxide formed from tetraethylorthosilicate (TEOS), silicon nitride, another nitrogen-free anti-reflective material, combinations, or these, or the like, although any suitable dielectric material may be used. The fourth dielectric layer 108 may be formed using a plasma enhanced chemical vapor deposition (PECVD) process, although other suitable processes, such as physical vapor deposition or a thermal process, may be used.

FIG. 1 additionally illustrates formation of a patterned layer 110 over the fourth dielectric layer 108. In some embodiments, patterned layer 110 may comprise a patternable material such as silicon which is deposited and then patterned. For example, in embodiments in which silicon is utilized, the patterned layer 110 may be deposited and then patterned using a photolithographic masking and etching process, whereby a photoresist (either by itself or as part of a tri-layer photoresist) is deposited, exposed, and developed, and then the photoresist is utilized as a mask during an anisotropic etching process. However, any suitable material and method of manufacture and/or patterning can be utilized. In some embodiments, the patterned layer 110 is etched to form a first pattern for later patterning of conductive lines from the layer to be patterned 80. In some embodiments, trenches 111 are formed along the x direction by the patterning of the patterned layer 110 between portions of the patterned layer 110.

FIG. 2 illustrates the deposition of mask layer 112 over the patterned layer 110 that forms part of the hard mask features 202 such as e.g. spacers (not illustrated in FIG. 2 but illustrated and described below with respect to FIG. 7) for defining features in the first (x-axis) direction. In some embodiments, the mask layer 112 may be formed of a material such as titanium oxide (TiO) using a method such as chemical vapor deposition, physical vapor deposition, atomic layer deposition, combinations of these, or the like. However, any suitable material and method of manufacture may be utilized. In some embodiments, the mask layer 112 is deposited conformally over the trenches in, forming trenches 113 in the mask layer 112 along the x direction.

Figure 3A:
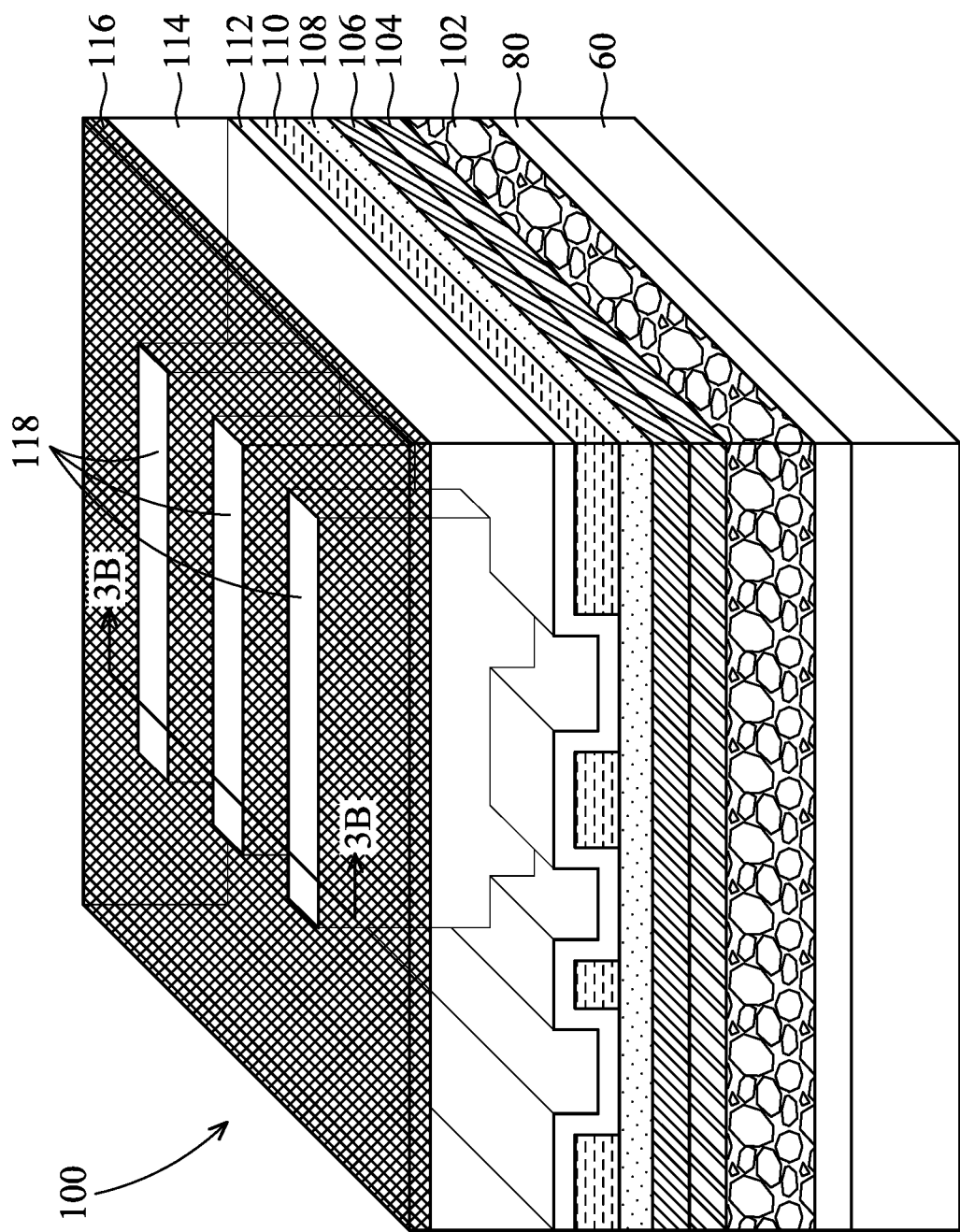
Figure 3B:
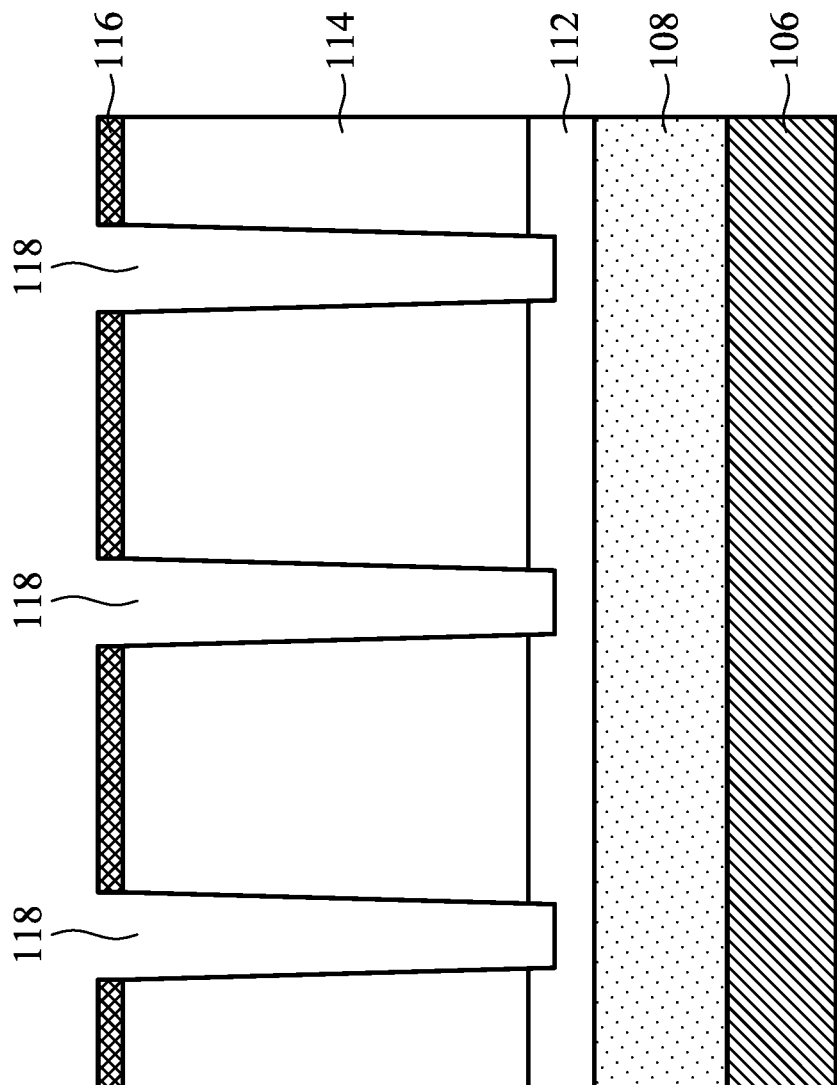
FIGS. 3B, 4A, 4B, 4C, 5A, and 5B illustrate cross-sectional views of the hard mask at various intermediate stages of fabrication, in accordance with some embodiments.

FIGS. 3A and 3B illustrate the deposition of a first photomask layer 114 and a second photomask layer 116 over the mask layer 112. FIG. 3B shows a cross-sectional view of a portion of a semiconductor structure 100 along line 3B-3B from FIG. 3A (with layers located below the third dielectric layer 106 being excluded from FIG. 3B for clarity) in the x-z plane. In some embodiments, the first photomask layer 114 may be a bottom layer of a multi-layer photoresist, and may comprise an organic or inorganic material that has an etch selectivity to the second photomask layer 116. As such, the second photomask layer 116 can be used as a mask layer to pattern the first photomask layer 114. In some embodiments, thicknesses of the first photomask layer 114 and the second photomask layer 116 are chosen to be substantially smaller than depths of the trenches 113. The total thickness of the first photomask layer 114 and the second photomask layer 116 may be in a range of about 700 Å to about 1300 Å.

The second photomask layer 116 may comprise a photosensitive material by itself or, in other embodiments, may be a bi-layer structure with a photosensitive material over another, middle layer of material such as silicon nitride, silicon oxynitride, SiOC, or the like to form a tri-layer photoresist along with the first photomask layer 114. Any suitable deposition method, such as PVD, CVD, spin coating, the like, or combinations thereof, may be used to form second photomask layer 116.

Once the first photomask layer 114 and the second photomask layer 116 have been formed, openings or cuts 118 (e.g., two, three, or more openings or trenches) are formed in the second photomask layer 116. In some embodiments, the second photomask layer 116 may be patterned by exposing the photosensitive material within the second photomask layer 116 to a patterned energy source (e.g., light) through, e.g., a reticle. The impact of the energy will cause a chemical reaction in those parts of the photosensitive material that were impacted by the patterned energy source, thereby modifying the physical properties of the exposed portions of the photoresist such that the physical properties of the exposed portions of the second photomask layer 116 are different from the physical properties of the unexposed portions of the second photomask layer 116. The second photomask layer 116 may then be developed with, e.g., a developer (not separately illustrated in FIG. 3), in order to separate the exposed portion of the second photomask layer 116 from the unexposed portion of the second photomask layer 116.

Next, the openings 118 in the second photomask layer 116 are extended through the bottom first photomask layer 114 (or the bottom first photomask layer 114 and the middle layer when the middle layer is present), using, for example, one or more anisotropic etching processes. In some embodiments, the openings 118 are extended all of the way through the first photomask layer 114 so as to expose each portion of the mask layer 112 that is present underneath the openings 118. As such, extension of the openings 118 form trenches which may have a high aspect ratio, such as having an aspect ratio of between about 3.5 and about 13 in at least one direction. However, any suitable aspect ratio may be utilized. In some embodiments, the ratio of the total depth of the openings 118 to the depth of the trenches 113 is in a range of about 3.5 and about 13. In some embodiments, top portions of the mask layer 112 are etched and the openings 118 extend into the mask layer 112.

Figure 4A:
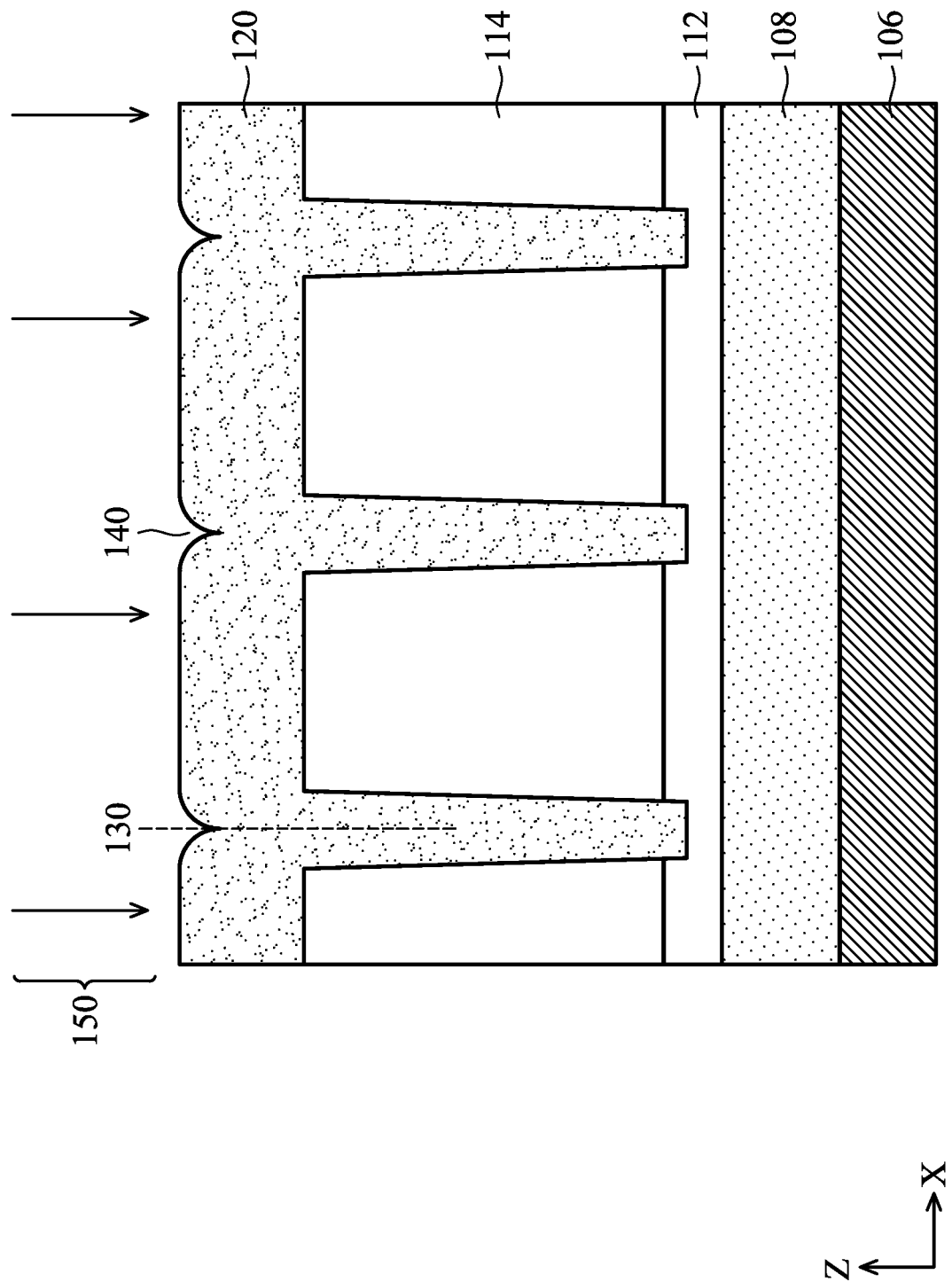

FIG. 4A follows from FIG. 3B and illustrates the formation of a first film material 120 in the openings 118 and over the bottom first photomask layer 114, in accordance with some embodiments. In some embodiments, prior to further processing the second photomask layer 116 is removed using, for example one or more ashing or etching processes. Once the second photomask layer 116 has been removed, a first film material 120, which may also be referred to as a gap-filling material 120 or a reverse material 120, is deposited into the openings 118 in order to achieve improved etch selectivity for subsequent etching processes and critical dimension (CD) shrinkage in subsequently formed metal lines. Using ALD to form hard mask features in the y direction one layer at a time may be useful in preserving CDs of the hard mask features in the y direction by maintaining a high aspect ratio of the hard mask features.

In some embodiments, the composition of the first film material 120 can be $SiO_x$, $SiC_xO_y$, SiN, a metal oxide or metal nitride such as e.g. TiO, $Al_2O_3$, or TiN, the like, or a combination thereof. The first film material 120 can be deposited using a deposition process such as atomic layer deposition (ALD), chemical vapor deposition (CVD), or physical vapor deposition (PVD). In some embodiments, in which the first film material 120 is formed using an ALD process, the ALD process may utilize a series of repeated cycles whereby a first precursor is pulsed into a deposition chamber to react with the first photomask layer 114, the first precursor is purged, a reaction gas is pulsed into the deposition chamber to react with the first precursor, the reaction gas is purged, and the cycle is repeated.

In some embodiments, the first precursor may be a precursor such as tris(dimethylamino)silane (3DMAS), bis(tertiary-butyl-amino) silane (BTBAS), bis(diethylamino) silane (BDEAS), trimethylaluminum (TMA, $Al(CH_3)_6$), diethylzinc (DEZ), tetrakis(dimethylamino)titanium (TD-MAT), titanium isopropoxide (TTIP), $TiCl_4$, tetrakis(dimethylamido)zirconium ($Zr(NMe_2)_4$), zirconium tetrachloride ($ZrCl_4$), tetrakis-dimethyl-amine tin (TDMASn), the like, or combinations thereof. The reaction gas may be an Ar-containing, oxygen-containing, $N_2$-containing or $CO_2$ gas, including Ar, $O_2$, $O_3$, $H_2O_2$, $CO_2$, or $N_2O$. By utilizing the first precursor and the reaction gas, each cycle of the atomic layer deposition process forms a monolayer of the desired material, with each successive and repeated cycle forming an additional monolayer of material.

Additionally, in some embodiments the temperature of the deposition process of the first film material 120 is kept at a low enough temperature to avoid decomposition of the polymer based materials that are present, such as the first photomask layer 114. For example, the temperature of the ALD process may be kept lower than 300° C. For example, a range of temperatures from room temperature to 300° C. can be used, in some embodiments. Additionally, by keeping the temperature below 300° C., such as between room temperature and 260° C., undesired outgassing can also be avoided. However, in other embodiments in which decomposition is not an issue, any suitable temperature may be utilized.

In some embodiments, a plasma treatment 150 is applied to the first film material 120 between cycles of the deposition process and/or after the last cycle of the deposition process. The plasma treatment 150 may be useful for expanding the critical dimensions of the first film material 120 to fill the openings 118 without seams. The plasma treatment 150 may also improve the properties of the first film material 120 leading to greater etch selectivity with other layers of the hard mask such as, e.g., the fourth dielectric layer 108. The plasma treatment 150 may be performed with gases such as Ar, $N_2$, $O_2$, $CO_2$, $N_2O$, the like, or a combination thereof. The plasma treatment 150 may be performed with a plasma power source power in a range of about 50 W to about 1000 W, with a bias power in a range of about 0 W to about 500 W, for a duration in a range of about 0.1 seconds to about 20 seconds, at a temperature in a range of about 50° C. to about 260° C.

In some embodiments in which an ALD process is utilized to deposit the first film material 120, the first film material 120 may have an indentation 140 that is centered within or above the opening 118 around the center line 130 of the opening 118 due to the geometry of the opening 118. However, in other embodiments in which the first film material 120 completely overfills the opening 118, the indentation 140 may not be present.

Figure 4B:
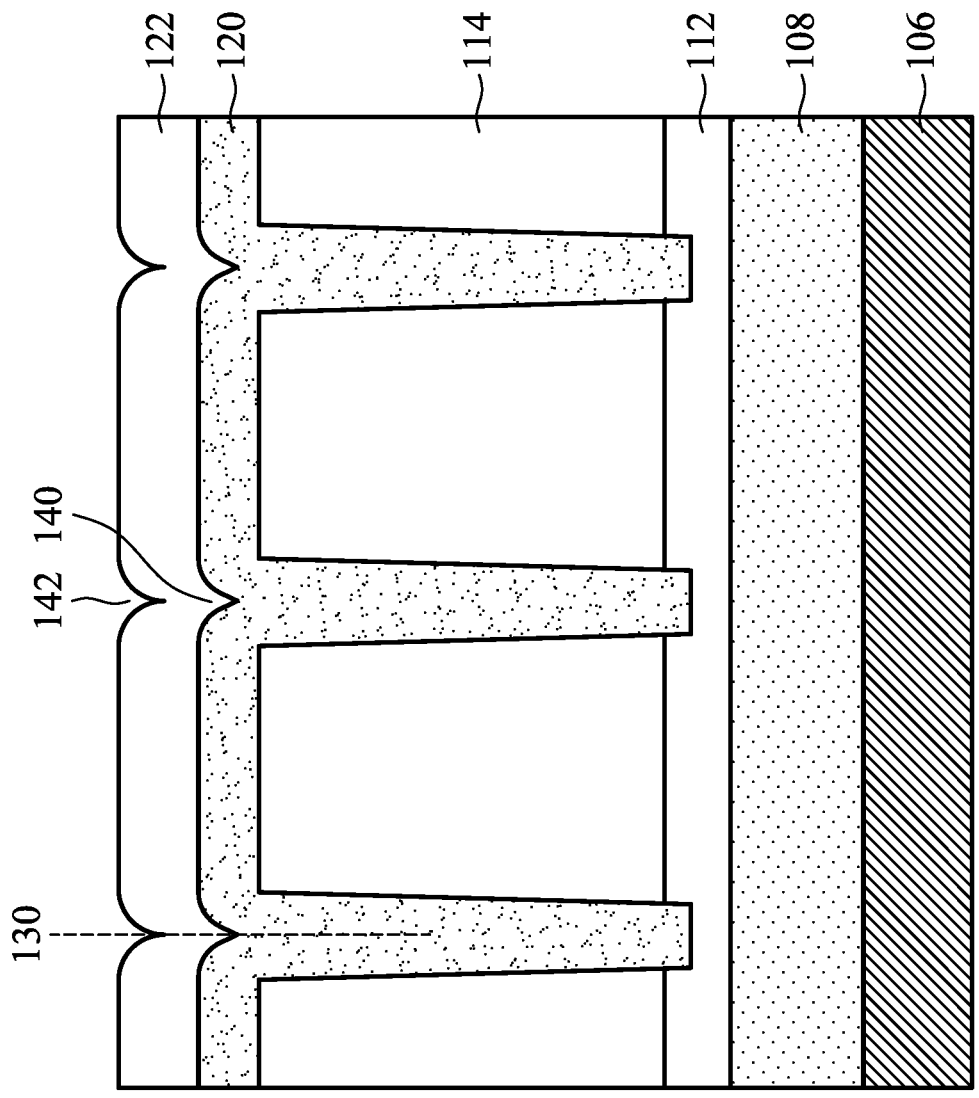

FIG. 4B illustrates another embodiment following from FIG. 3B in which a second film material 122 is formed over the first film material 120, which may be deposited by a substantially similar process as described above in reference to FIG. 4A. The second film material 122 may be a sacrificial layer for gap-filling in the opening 118 which may reduce defects from insufficient thickness of gap-filling material in the openings 118. In some embodiments, the second film material 122 may be deposited in-situ (e.g., in the same deposition chamber as the first material 120) using a same deposition process as the first material 120, such as ALD, CVD or PVD. In some embodiments, the second film material 122 may be a material different from the first film material 120 so that the second film material 122 can be used for etch selectivity enhancement or thermal selectivity enhancement. In some embodiments, the second film material 122 may be $SiO_x$, $SiC_xO_y$, SiN, a metal oxide or metal nitride such as e.g. TiO, $Al_2O_3$, or TiN, the like, or a combination thereof. However, any suitable materials may be utilized. The second film material 122 may be formed with some of the same precursors and reaction gases as listed above for the first film material 120 in reference to FIG. 4A.

In some embodiments, the second film material 122 may be deposited to a thickness (measured from the top surface of the first film material 120 in the vertical z direction) in a range of about 10 nm to about 40 nm. However, any suitable thickness may be utilized.

In some embodiments in which an ALD process is utilized to deposit the second film material 122, the second film material 122 may have an indentation 142 that is centered over an indentation 140 in the first film material 120 that is within or above the opening 118 around the center line 130 of the opening 118 due to the geometry of the opening 118. However, in other embodiments in which the opening 118 is completely overfilled, the indentation 142 may not be present.

Figure 4C:
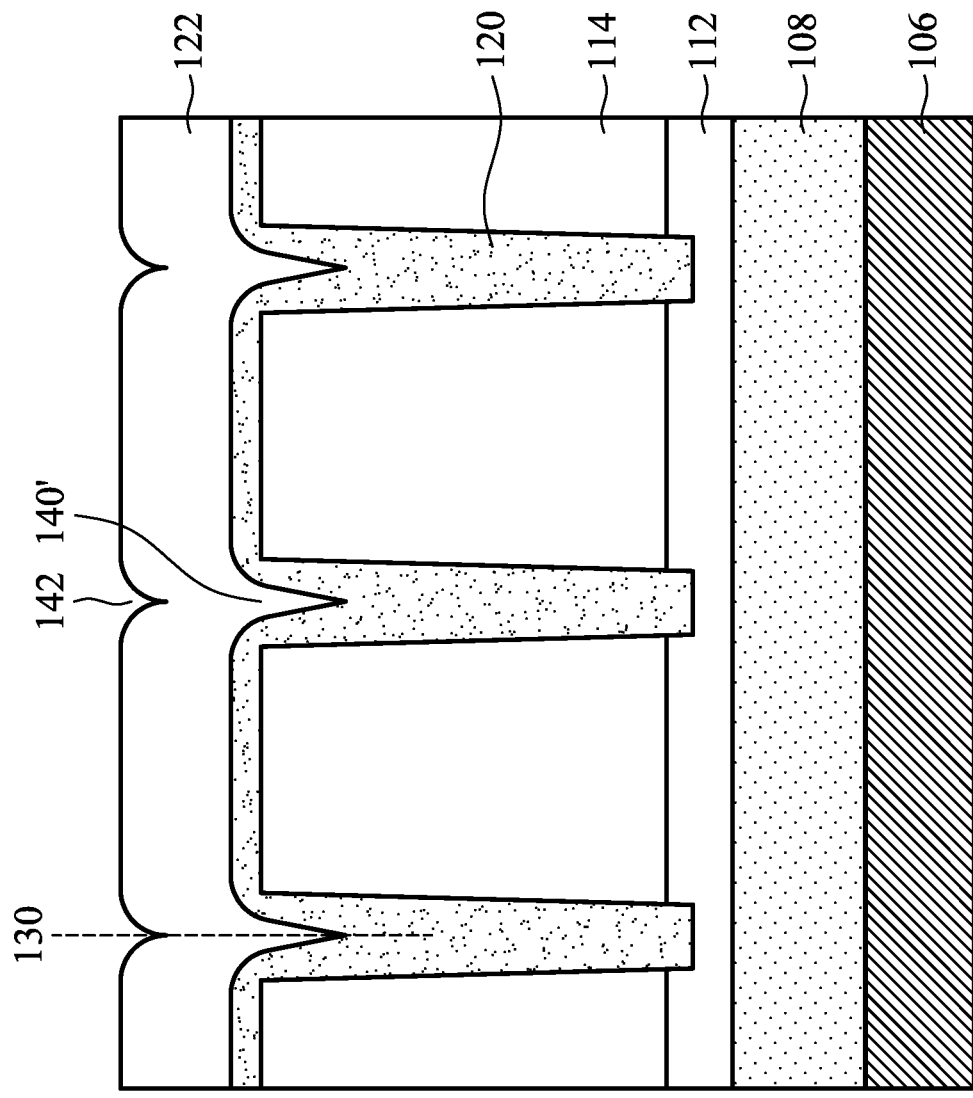

FIG. 4C illustrates yet another embodiment following from FIG. 3B in which the second film material 122 is formed over the first film material 120 and extends into the openings 118. The first film material 120 and the second film material 122 may be formed by substantially similar processes as described above in reference to FIGS. 4A and 4B. The first film material 120 may be deposited to a thickness in a range of about 6 nm to about 24 nm, so that indentations 140' in the first film material 120 extend into the openings 118 by a depth in a range of about 4 nm to about 34 nm measured in the z direction below the top surface of the first photomask layer 114. The second film material 122 may fill the indentations 140' and extend into the openings 118.

Figure 5A:
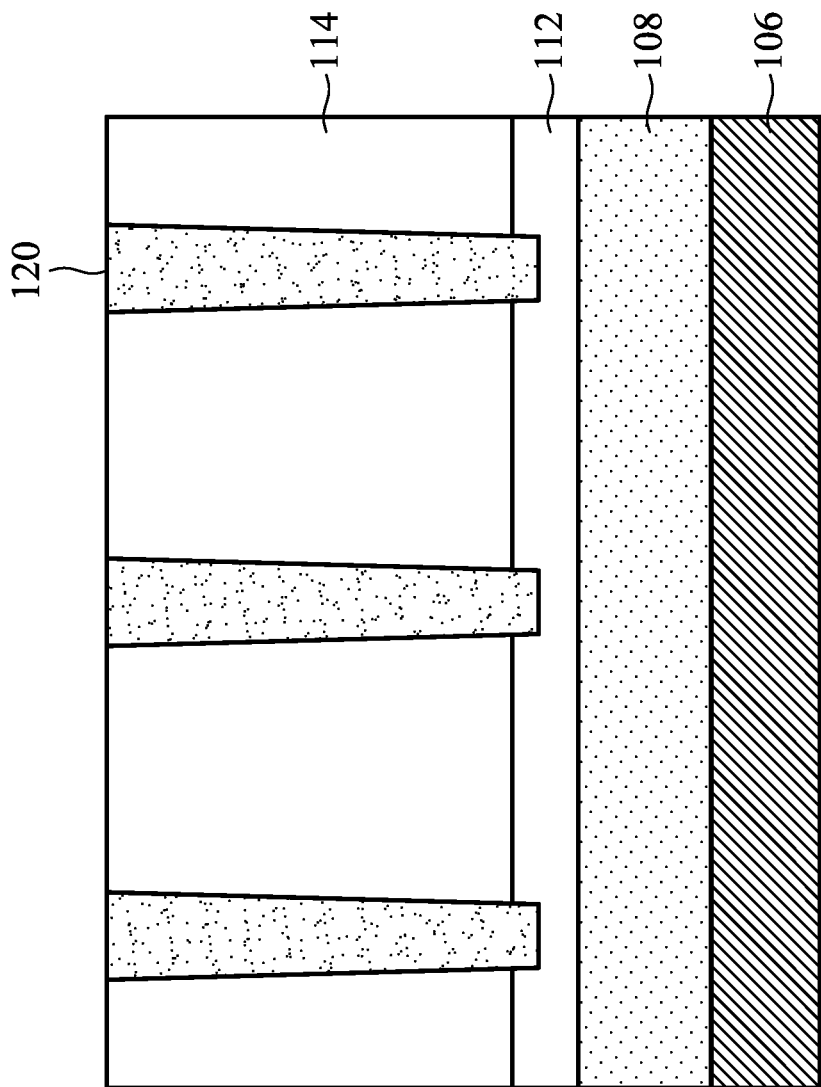

FIG. 5A illustrates embodiments following from FIGS. 4A and 4B. In FIG. 5A, a removal process is performed to remove excess materials of the first film material 120 and/or the second film material 122 over the first photomask layer 114. In some embodiments, the removal process may be performed using a chemical-mechanical polishing (CMP) step or etching step such as using a $C_xF_y/C_xH_yF_z$ based gas to planarize the surface of mask layer 114 as well as the upper surfaces of the first film material 120 and the second film material 122. However, any suitable removal process may be utilized. In some embodiments, the height of the first film material 120 can be reduced to be at least co-planar with a top surface of mask layer 112 (shown below, FIG. 6A) using, e.g., one or more anisotropic etching processes, such as an anisotropic etching process using an etchant such as a $C_xF_y/C_xH_yF_z$ based gas. In these embodiments, upper portions of the first film material 120 are removed so that the remaining portions of the first film material 120 are within trenches of the mask layer 112 and top surfaces of the remaining portions of the first film material 120 are level with top surfaces of the mask layer 112. However, any suitable reduction process may be utilized.

Figure 5B:
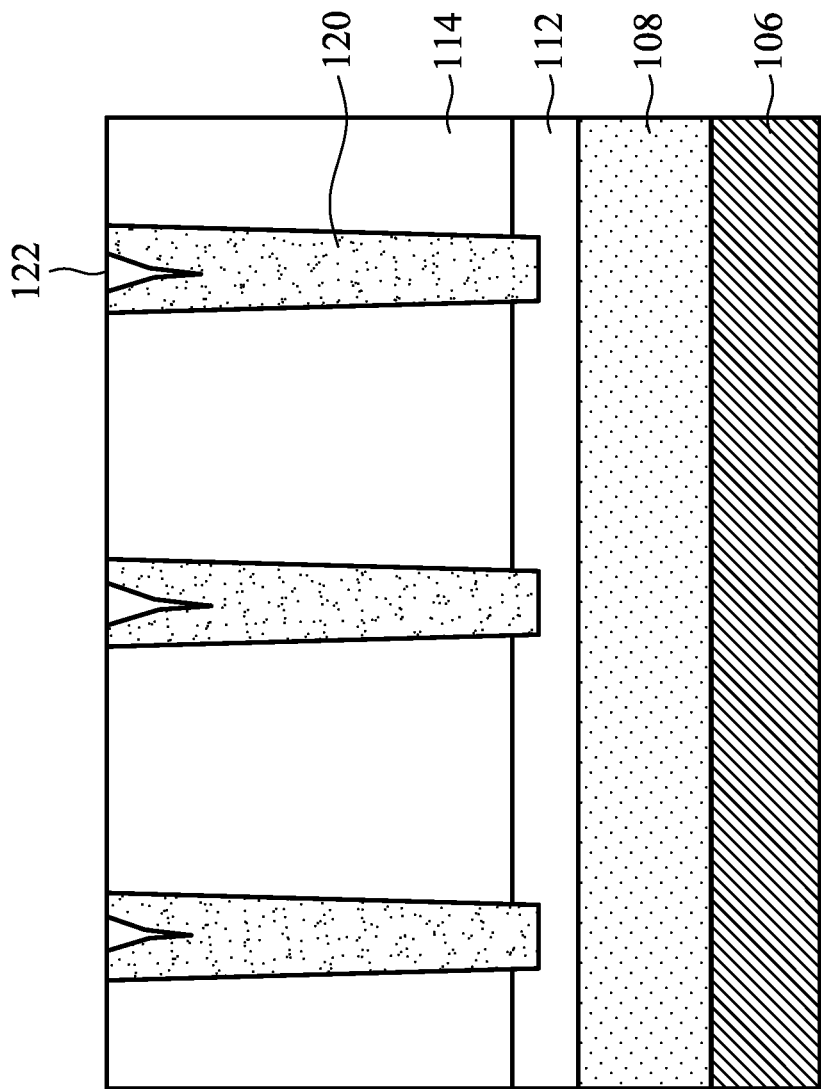

FIG. 5B illustrates embodiments following from FIG. 4C. In FIG. 5B, a removal process substantially similar to the removal process described above with respect to FIG. 5A is performed to remove excess materials of the first film material 120 and the second film material 122 over the first photomask layer 114 with portions of the second film material 122 remaining in the openings 118. Having portions of the first film material 120 remaining may be useful for etch selectivity enhancement or thermal selectivity enhancement in subsequent processes.

Figure 6A:
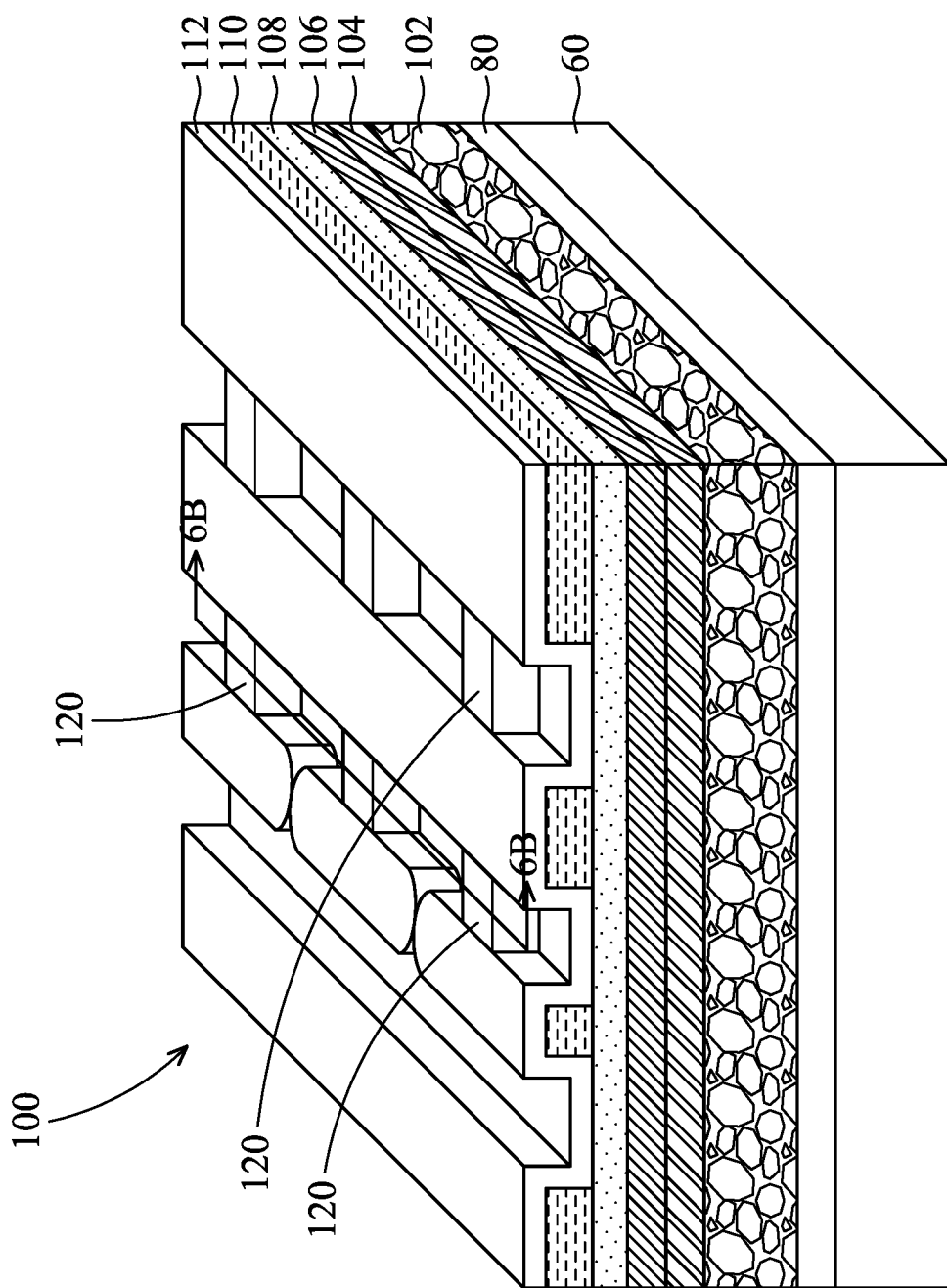
FIGS. 6A, 6B, 6C, and 6D illustrate perspective and cross-sectional views of the hard mask at various intermediate stages of fabrication, in accordance with some embodiments.
Figure 6B:
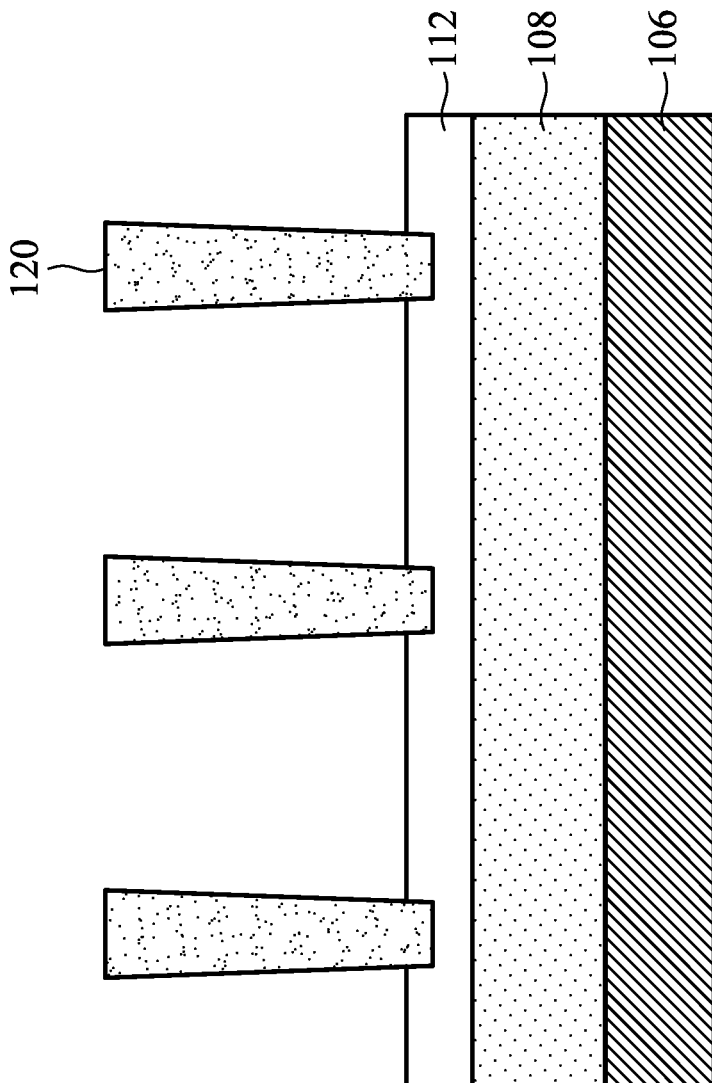

FIGS. 6A and 6B illustrate embodiments following from FIG. 5A. In FIGS. 6A and 6B, the first photomask layer 114 is removed. In some embodiments, the removal may be performed with one or more ashing or etching steps using etchants such as $O_2$ based gas. In a particular embodiment the first photomask layer 114 may be removed using an ashing process. However, any suitable removal processes, such as a wet etching process, may also be utilized. Remaining hard mask features 202 (illustrated below, see FIG. 7) comprising the first film material 120 will still act as a hard mask during the following processing steps.

FIG. 6A shows the resulting structure located over the first dielectric layer 102, the second dielectric layer 104, the third dielectric layer 106, and the fourth dielectric layer 108, previously described. Also shown are the patterned layer 110, and the mask layer 112 that will be used to pattern the underlying structures. The first dielectric layer 102, the second dielectric layer 104, the third dielectric layer 106, the fourth dielectric layer 108, the patterned layer 110, and the mask layer 112 are substantially the same as were previously shown and described in FIGS. 1-3, except that the first photomask layer 114 and the second photomask layer 116 have been removed. However, as can be seen, the first film material 120 has now been formed within the trenches of the mask layer 112. FIG. 6B illustrates a cross-sectional view of a portion of the semiconductor structure 100 along line 6B-6B from FIG. 6A showing the remaining portions of the first film material 120.

In some embodiments following directly from FIG. 4B or 4C where a portion of the second film material 122 remains on the first film material 120, the second film material 122 can be removed along with the first photomask layer 114 due to the high etch selectivity between the first film material 120 and the second film material 122. As such, the first film material 120 will remain after the removal process. Furthermore, the etch selectivity between the first film material 120 and the patterned layer 110 is also high enough to prevent damage to the patterned layer 110, thereby helping to prevent pattern failure.

Figure 6C:
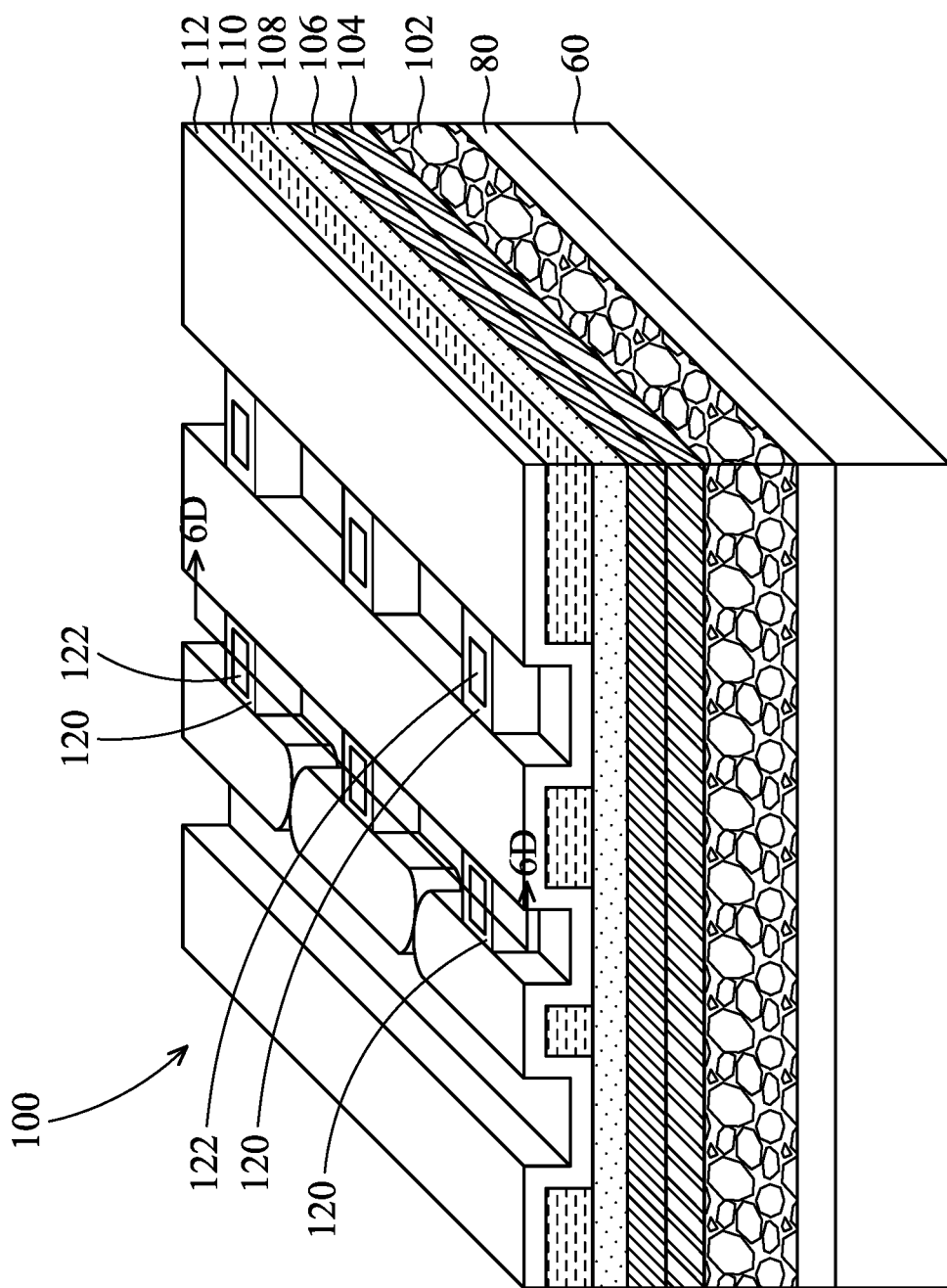
Figure 6D:
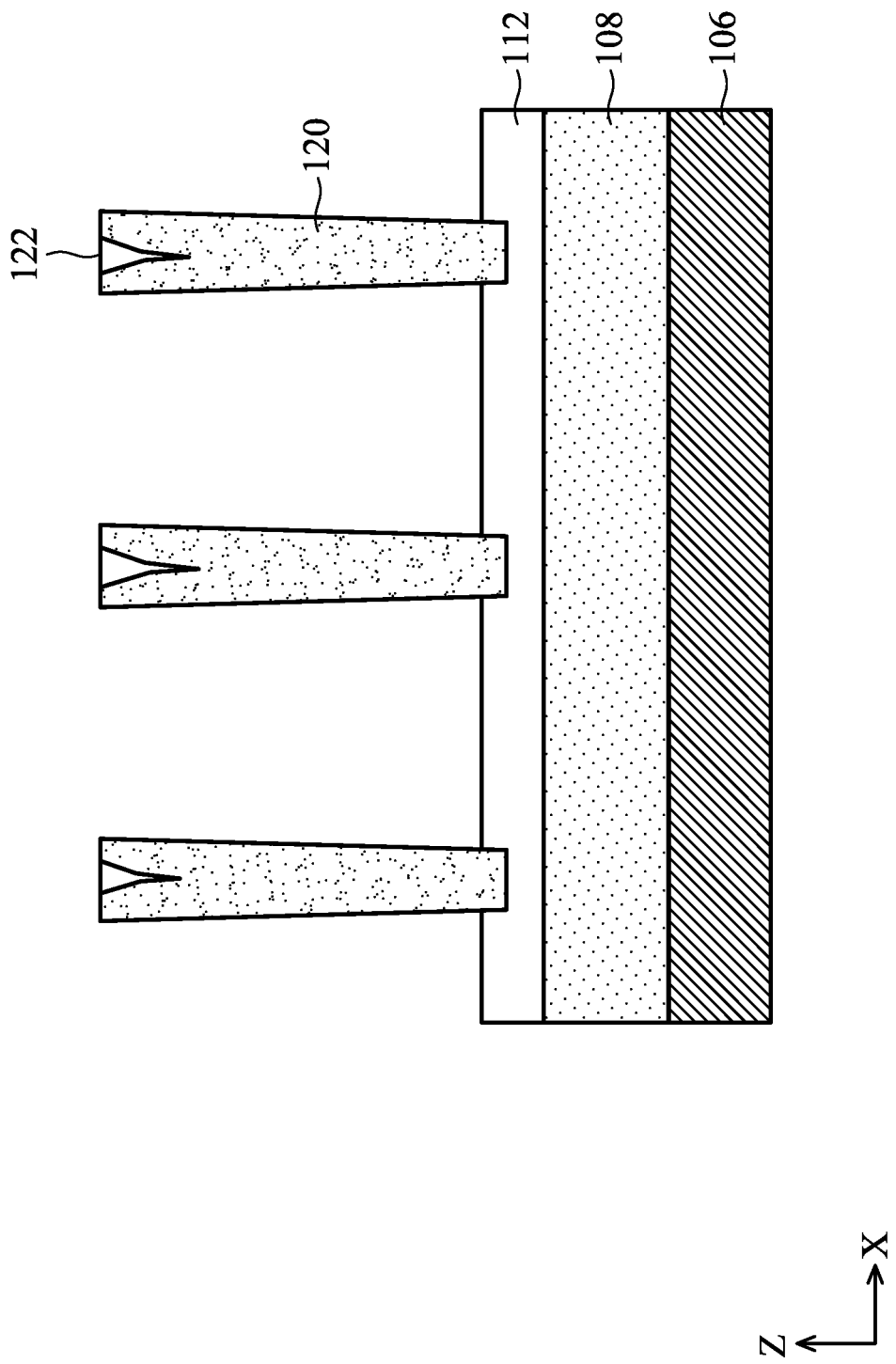

FIGS. 6C and 6D illustrate embodiments following from FIG. 5B, which illustrates portions of the second film material 122 remaining on the first film material 120. FIG. 6C is substantially similar to FIG. 6A and FIG. 6D is substantially similar to FIG. 6B, except that portions of the second film material 122 remain on the remaining portions of the first film material 120.

Figure 7A:
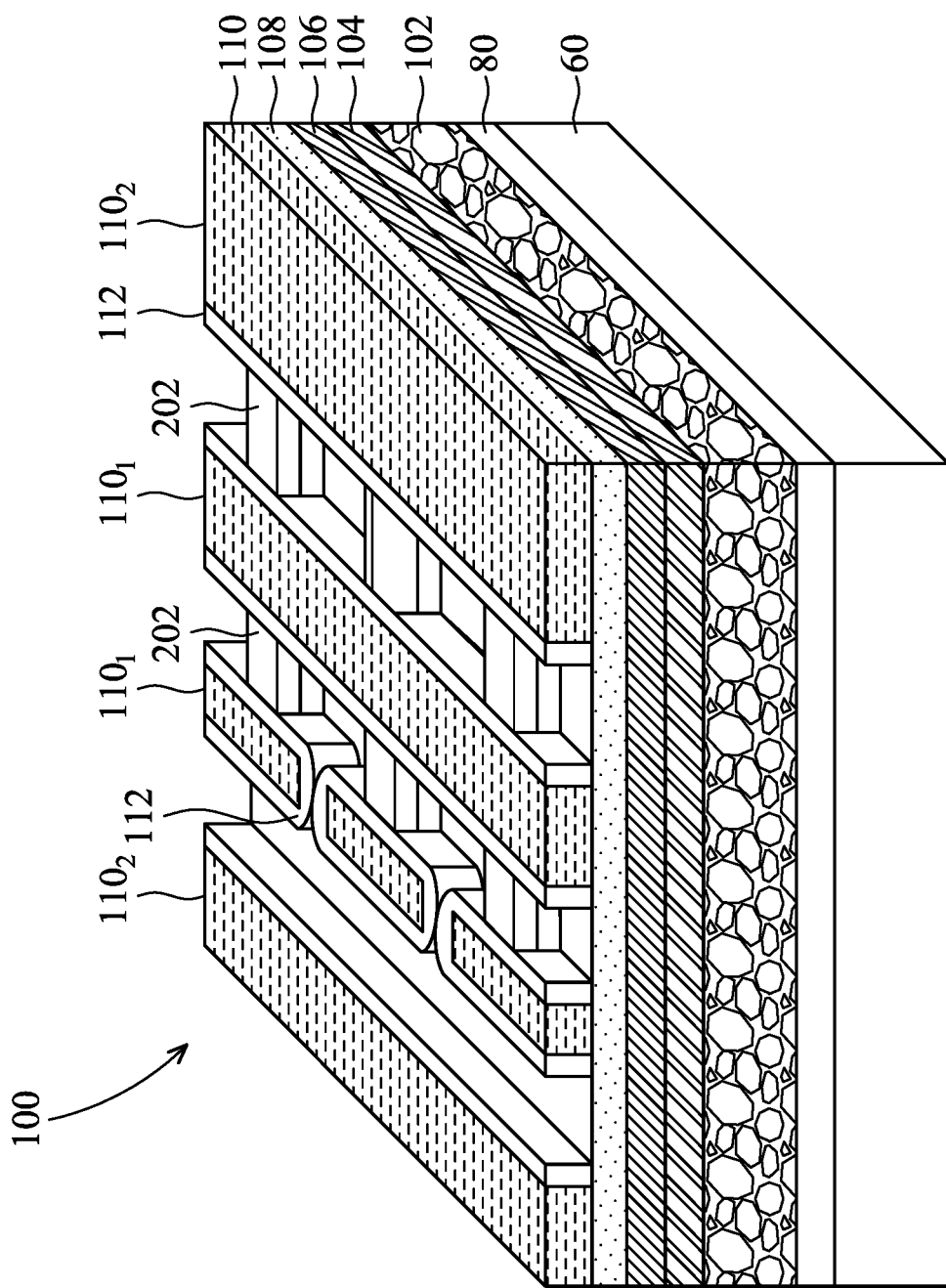
FIGS. 7A, 7B, 8, 9, and 10 illustrate perspective and top-down views of the hard mask and a patterned layer beneath the hard mask at various final stages of fabrication, in accordance with some embodiments.
Figure 7B:
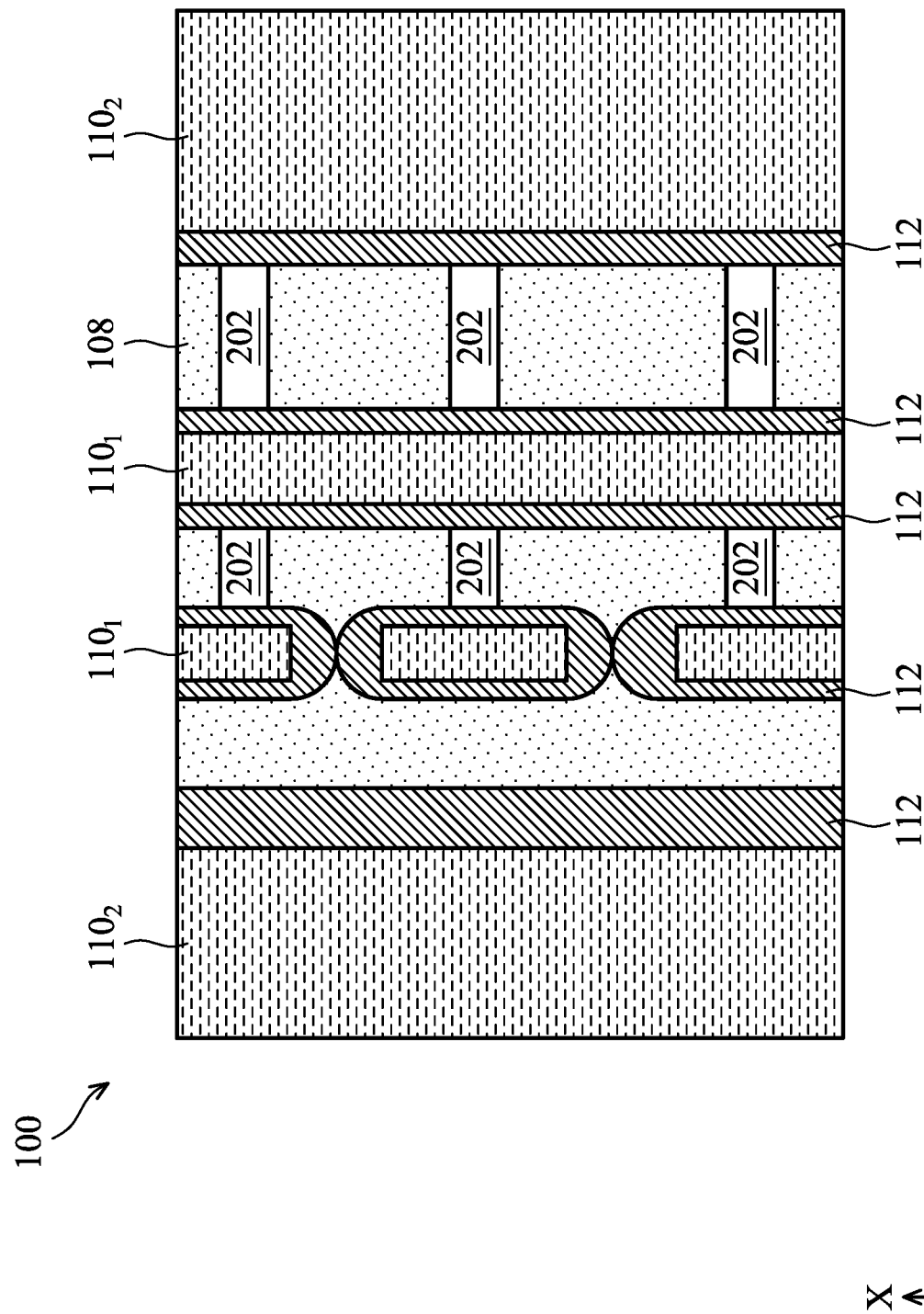

FIG. 7A follows from FIGS. 6A-D in a perspective view and illustrates a patterning of the mask layer 112 using the first film material 120 as a mask to form hard mask features 202 such as e.g. spacers (comprising both the first film material 120 and the mask layer 112). FIG. 7B shows a top-down view of FIG. 7A. FIG. 7A also shows the hard mask features 202 over the first dielectric layer 102, the second dielectric layer 104, the third dielectric layer 106, and the fourth dielectric layer 108, previously described. Additionally, portions of the mask layer 112 remain along sidewalls of the patterned layer 110, while upper surfaces of the patterned layer 110 are exposed. If desired, certain portions of the patterned layer 110 may be identified as removable portions $110_1$ for removal so that the removable portions $110_1$ are not available for use as a mask in subsequent etching processes (described further below with respect to FIG. 8). Additionally, other portions of the patterned layer 110 may be identified as remaining portions $110_2$ so that the remaining portions $110_2$ remain and are available for use as a mask in subsequent etching processes.

In some embodiments, the mask layer 112 may be patterned using one or more etching processes, such as an anisotropic etching process using an etchant such as $C_xF_y$, $C_xH_yF_z$, or $C_xH_yCl_z$ based gas. However, any suitable etching process may be utilized. By first filling the opening 118 (see FIGS. 4A-4C) and then removing the outside layers of material, the hard mask features 202 can be formed with the high aspect ratio of the openings 118. As such, the hard mask features can be formed with a middle critical dimension (MCD—e.g., the width of the hard mask feature 202 at one-half of the height of the hard mask feature 202) in a range of about 10 nm to about 25 nm and a height in a range of about 20 nm to about 40 nm. However, any suitable dimensions may be utilized. In some embodiments following from FIGS. 6C and 6D in which portions of the second film material 122 remained on the first film material 120, the remaining portions of the second film material 122 are removed by the etching process used to pattern the mask layer 112. The etch selectivity and/or thermal selectivity between the second film material 122 and the first film material 120 may be useful for forming the hard mask features 202 without over-etching the first film material 120 or the mask layer 112, which may disadvantageously reduce the widths of the hard mask features 202. The selectivity and/or thermal selectivity between the second film material 122 and the first film material 120 may enable the preserving of the widths of the hard mask features 202 without MCD enlargement of the widths of the hard mask features 202.

Figure 8:
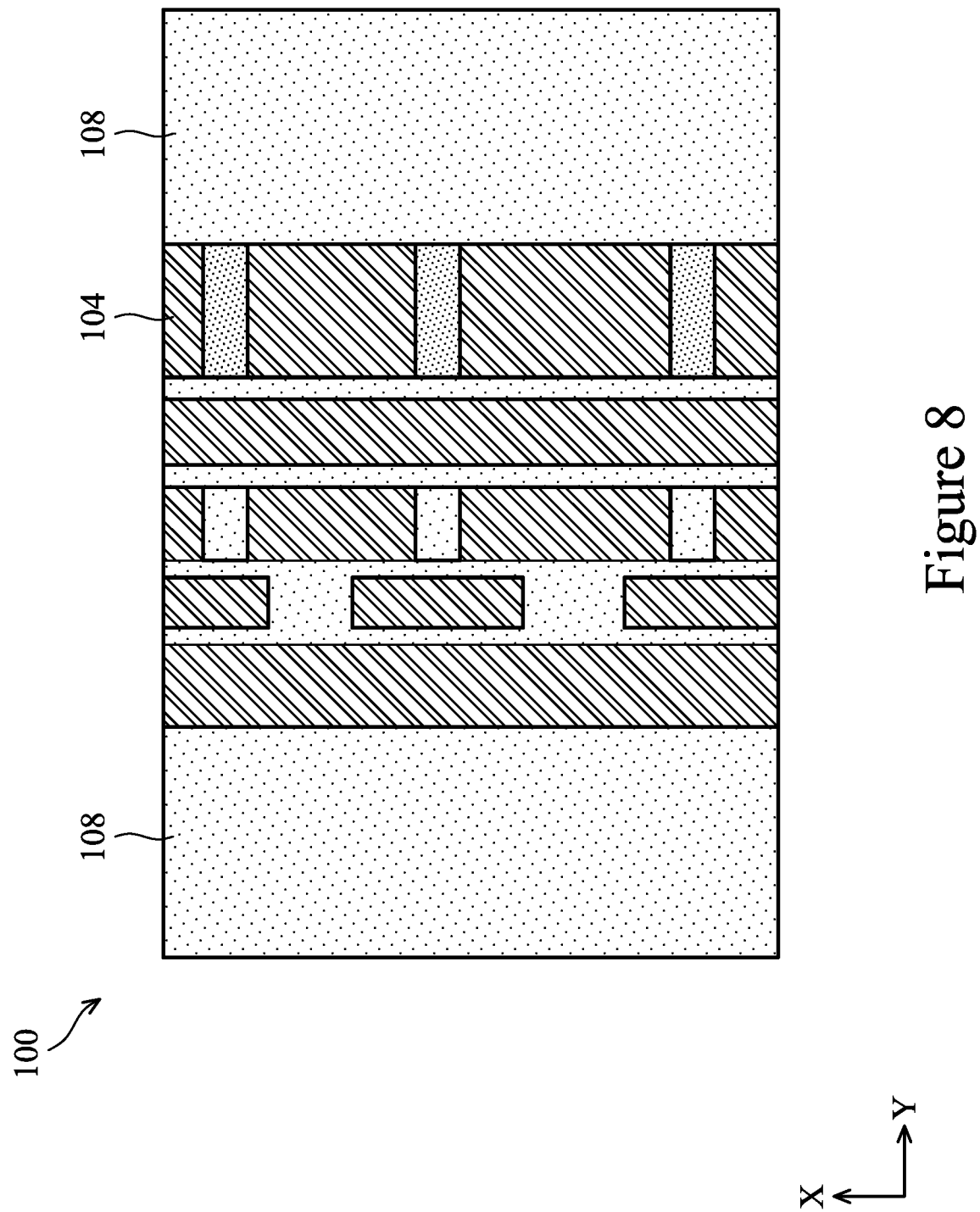

Looking next at FIG. 8, which is illustrated in a top-down view following from FIG. 7B, the removable portions $110_1$ of the patterned layer 110 are removed. In some embodiments, the removable portions $110_1$ are removed by initially placing and patterning a photoresist (not separately illustrated in FIG. 8) so that the photoresist covers and protects the remaining portions $110_2$ while exposing the removable portions $110_1$. Once the remaining portions $110_2$ are protected, the removable portions $110_1$ are then removed using one or more etching processes, such as wet etching processes or dry etching processes, before the photoresist is removed using, for example, an ashing process.

FIG. 8 also illustrates that, once the removable portions $110_1$ of the patterned layer 110 have been removed, the remaining portions $110_2$, the hard mask features 202, and the mask layer 112 along the sidewalls are utilized to pattern the fourth dielectric layer 108 and the third dielectric layer 106. In some embodiments, the pattern may be transferred using an anisotropic etching process such as a dry etching process. However, any suitable etching process may be utilized.

Once the pattern of the hard mask features 202, the remaining portions $110_2$ of the patterned layer 110, and the mask layer 112 along the sidewalls has been transferred, the hard mask feature 202, the remaining portions $110_2$ of the patterned layer 110, and the mask layer 112 may be removed, exposing upper surfaces of the fourth dielectric layer 108. In some embodiments, one or more etching processes, such as one or more wet etches or dry etches, may be utilized to remove the hard mask feature 202 and the remaining portions $110_2$ of the patterned layer 110. However, any suitable removal process may be utilized.

Figure 9:
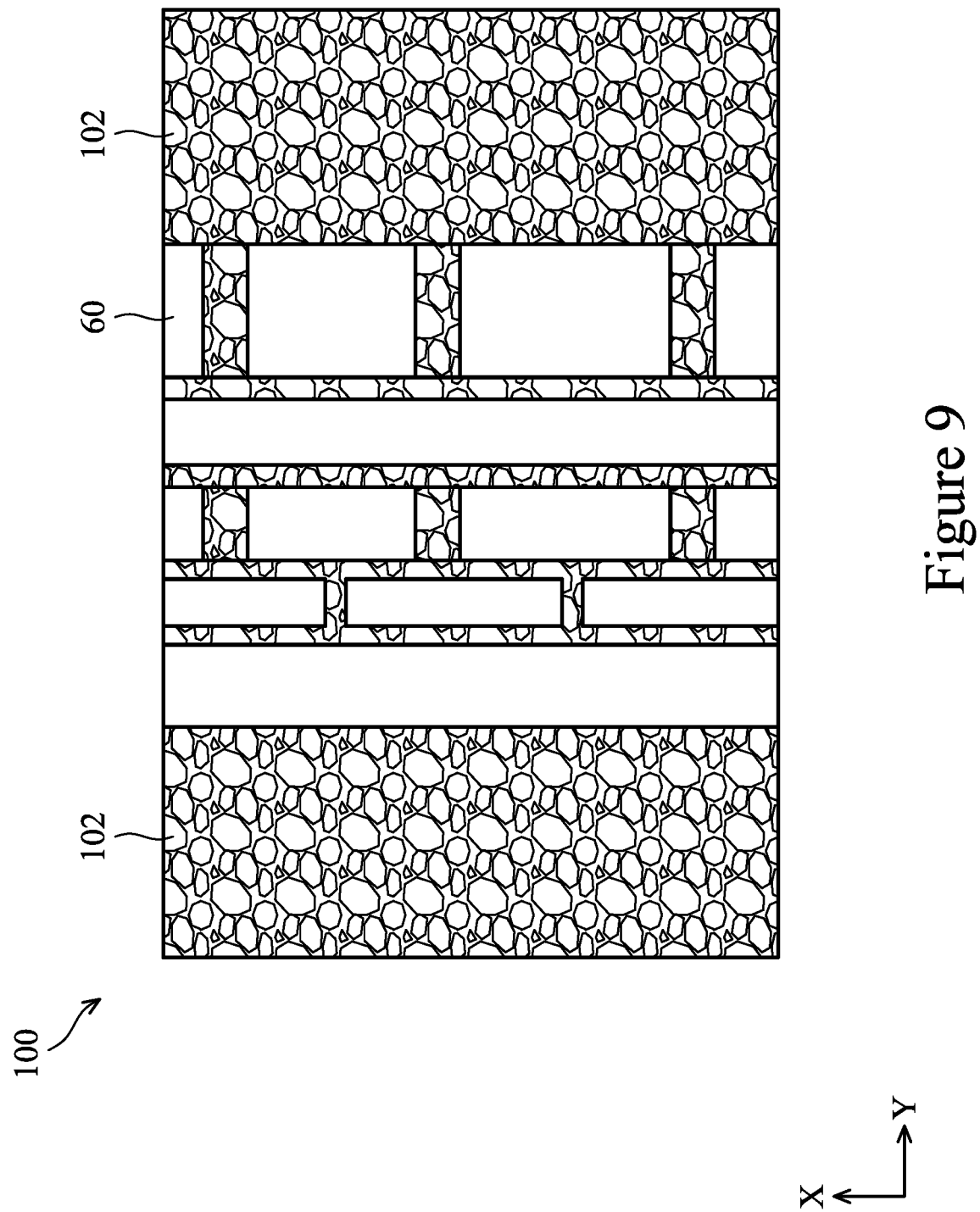

FIG. 9 illustrates a transferal of the pattern from the fourth dielectric layer 108 and the third dielectric layer 106 to the second dielectric layer 104, the first dielectric layer 102, and, eventually, to the layer to be patterned 80 above the substrate 60. In some embodiments, the pattern may be transferred using one or more anisotropic etching processes such as dry etching processes. However, any suitable etching process or combination of etching processes may be utilized.

Additionally, once the pattern has been transferred, and the layer to be patterned 80 has been patterned, some of the overlying structures may be removed. In some embodiments, the fourth dielectric layer 108, the third dielectric layer 106, and the second dielectric layer 104 may each be removed to expose the top surface of the first dielectric layer 102. In some embodiments, the fourth dielectric layer 108, the third dielectric layer 106, and the second dielectric layer 104 may be removed using one or more etching processes, such as a series of wet etching processes or dry etching processes. However, any suitable combination of etching processes may be utilized.

Figure 10:
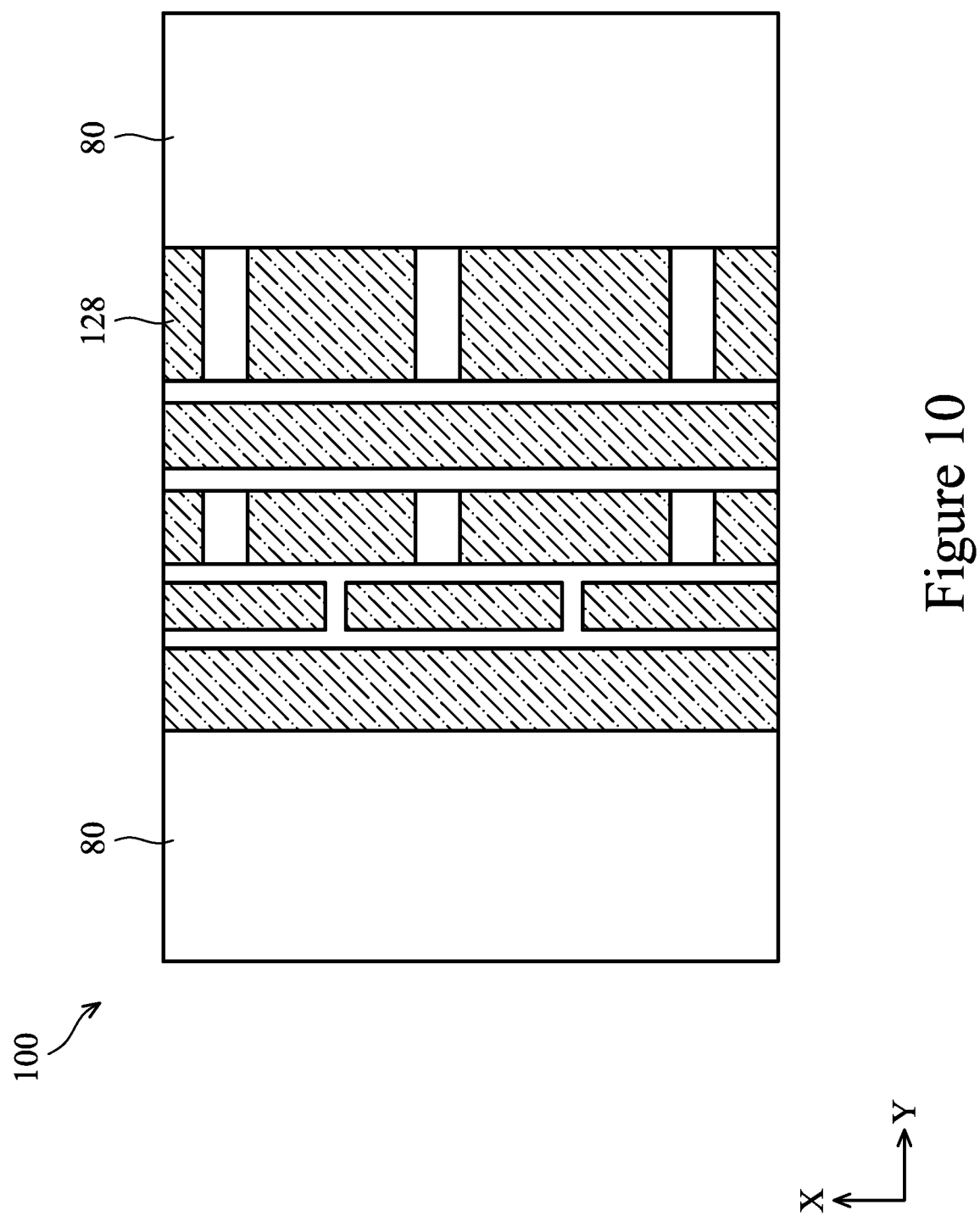

FIG. 10 shows that, once the layer to be patterned 80 has been patterned, additional processing may be performed. In some embodiments in which the layer to be patterned 80 is a dielectric layer to form a metallization layer, a conductive material 128 may be placed in the pattern of the layer to be patterned 80. In some embodiments, the conductive material 128 may be a material such as copper, tungsten, aluminum, combinations of these, or the like, that is deposited using a deposition process such as electroplating, electroless plating, chemical vapor deposition, physical vapor deposition, atomic layer deposition, combinations of these, or the like. However, any suitable material and method of manufacture may be utilized.

The conductive material 128 may be deposited to fill and/or overfill the pattern of the layer to be patterned 80 and the first dielectric layer 102. Once overfilled, a planarization process, such as a chemical mechanical polishing process, may be performed to remove excess portions of the conductive material 128 from outside of the pattern and to planarize the conductive material 128 to the layer to be patterned 80, thereby also removing the first dielectric layer 102. However, any suitable planarization process may be utilized.

By forming the hard mask features 202 with a single film material using a plasma treatment or with two film materials with etch selectivity between them as described herein, smaller and smaller features may be achieved in the manufacturing process of semiconductor devices. For example, in embodiments in which the embodiments are utilized to form conductive lines in a metallization layer, end-to-end distances between lines (e.g., the cut metal distance), can be reduced without defects, thereby increasing the overall process window of the manufacturing process.

Additionally, in other embodiments, the advanced lithography process, method, and materials described above can be used in many other applications, including in the formation of fin-type field effect transistors (FinFETs). For example, the fins may be patterned to produce a relatively close spacing between features, for which the above disclosure is well suited. In addition, spacers used in forming fins of FinFETs, also referred to as mandrels, can be processed according to the above disclosure.

In accordance with an embodiment, a method of forming a semiconductor device includes: forming a mask layer over a substrate; forming an opening in the mask layer; depositing a gap-filling material in the opening; performing a plasma treatment on the gap-filling material; reducing the height of the gap-filling material; removing the mask layer; and patterning the substrate using the gap-filling material as a mask. In an embodiment, the gap-filling material includes $SiO_x$, $SiC_xO_y$, SiN, TiO, $Al_2O_3$, or TiN. In an embodiment, depositing the gap-filling material includes an atomic layer deposition (ALD) process including a precursor chosen from the group consisting of tris(dimethylamino)silane (3DMAS), bis(tertiary-butyl-amino) silane (BTBAS), bis(diethylamino)silane (BDEAS), trimethylaluminum (TMA, $Al(CH_3)_6$), diethylzinc (DEZ), tetrakis(dimethylamino)titanium (TDMAT), titanium isopropoxide (TTIP), $TiCl_4$, tetrakis(dimethylamido)zirconium $(Zr(NMe_2)_4)$, zirconium tetrachloride $(ZrCl_4)$, and tetrakis-dimethyl-amine tin (TDMASn). In an embodiment, the ALD process further includes a reaction gas chosen from the group consisting of Ar, $O_2$, $O_3$, $H_2O_2$, $CO_2$, and $N_2O$. In an embodiment, the ALD process is performed at a temperature below 300° C. In an embodiment, the method further includes performing multiple cycles of the ALD process and performing the plasma treatment between cycles of the ALD process. In an embodiment, the plasma treatment includes using Ar or $N_2$ as a plasma gas. In an embodiment, the plasma treatment includes a duration in a range of 0.1 seconds to 20 seconds. In an embodiment, the plasma treatment includes a plasma power in a range of 50 W to 1000 W and a bias power in a range of 0 W to 500 W. In an embodiment, the plasma treatment is performed at a temperature in a range of 50° C. to 260° C.

In accordance with another embodiment, a method of forming a semiconductor device includes: depositing a top mask layer on a hard mask, the hard mask being on a substrate; patterning an opening in the top mask layer; forming a first film material over the top mask layer, the first film material filling the opening; performing a plasma treatment on the first film material; forming a second film material over the first film material, the second film material having a high etch selectivity with the first film material; removing the second film material, a portion of the first film material over the top mask layer, and the top mask layer; and patterning the hard mask using the remaining portion of the first film material as a mask. In an embodiment, the first film material and the second film material are chosen from the group consisting of $SiO_x$, $SiC_xO_y$, SiN, TiO, $Al_2O_3$, and TiN. In an embodiment, the second film material is formed with a thickness in a range of 10 nm to 40 nm. In an embodiment, forming the first film material forms a first indentation in the first film material centered over the opening. In an embodiment, forming the second film material forms a second indentation in the second film material centered over the first indentation.

In accordance with yet another embodiment, a method for manufacturing an integrated circuit includes: forming a first layer over a semiconductor substrate; depositing a hard mask on the first layer; forming a photomask layer over the hard mask; patterning a plurality of openings in the photomask layer; performing a deposition cycle of a first film material, the deposition cycle including: depositing the first film material over the photomask layer, the first film material filling the plurality of openings; and performing a plasma treatment on the first film material; removing the photomask layer, the removing the photomask layer also removing a portion of the first film material over the photomask layer; patterning the hard mask using the remaining portion of the first film material as a mask; and patterning the first layer using the patterned hard mask as a mask. In an embodiment, the method further includes: forming a second film material over the first film material, the second film material having a high etch selectivity with the first film material; and removing the second film material. In an embodiment, the removing the second film material is performed while removing the photomask layer. In an embodiment, the method further includes the removing the photomask layer also removing a portion of the second film material and the patterning the hard mask also using the remaining portion of the second film material as a mask. In an embodiment, the patterning the hard mask further includes removing the remaining portion of the second film material.

One general aspect of embodiments disclosed herein includes a method of forming a semiconductor device, forming a mask layer over a substrate. The method also includes forming an opening in the mask layer, the opening extending into the substrate. The method also includes non-conformally depositing a gap-filling first film material in the opening, the gap-filling material filling the opening, a bottom portion of the gap-filling material extending below a top surface of the substrate. The method also includes performing a plasma treatment on the gap-filling material. The method also includes forming a second film material over the gap-filling first film material, the second film material having a high etch selectivity with the gap-filling first film material, a lowest point of the film material being above a top surface of the mask layer. The method also includes removing at least a portion of the second film material, a portion of the gap-filling first film material over the mask layer, and the mask layer. The method also includes patterning the substrate using the remaining portion of the gap-filling first film material as a mask.

Another general aspect of embodiments disclosed herein includes a method of forming a semiconductor device, depositing a top mask layer on a hard mask, the hard mask overlying being on a patterned layer, the patterned layer having formed therein a trench, the trench extending along a first longitudinal axis when viewed from a top-down perspective substrate. The method also includes trench. The method also includes patterning forming an opening in the top mask layer, the opening, when viewed from a top-down perspective, extending along a second longitudinal axis perpendicular to the first longitudinal axis. The method also includes forming a first film material over the top mask layer, the first film material filling the opening. The method also includes performing a plasma treatment on the first film material. The method also includes forming a second film material over the first film material, the second film material having a high etch selectivity with the first film material. The method also includes removing the second film material, a portion of the first film material over the top mask layer, and the top mask layer. The method also includes and patterning the hard mask using the remaining portion of the first film material as a mask.

Yet another general aspect of embodiments disclosed herein includes a method of forming a semiconductor device, forming a first layer over a semiconductor substrate. The method also includes depositing a hard mask on over the first layer. The method also includes forming a photomask layer over the hard mask. The method also includes patterning a plurality of openings in the photomask layer. The method also includes performing a deposition cycle of a first film material, the deposition cycle may include: depositing the first film material over the photomask layer, the first film material filling the plurality of openings. The method also includes and performing a plasma treatment on the first film material. The method also includes removing the photomask layer, the removing the photomask layer also removing and a portion of the first film material over the photomask layer. The method also includes patterning the hard mask using the remaining portion of the first film material as a mask. The method also includes and patterning the first layer using the patterned hard mask as a mask.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, the method comprising:
   forming a mask layer over a substrate;
   forming an opening in the mask layer;
   non-conformally depositing a first film material in the opening;
   forming a second film material over the first film material, the second film material having a high etch selectivity with the first film material;
   removing at least a portion of the second film material, a portion of the first film material over the mask layer, and the mask layer; and
   patterning the substrate using the remaining portion of the first film material as a mask.

2. The method of claim 1, wherein the step of non-conformally depositing a first film material includes performing a plasma treatment on the first film material.

3. The method of claim 1, wherein the step of removing at least a portion of the second film material includes removing all of the second film material.

4. The method of claim 1, wherein the substrate includes a hard mask layer overlying a plurality of dielectric layers.

5. The method of claim 4, wherein the step of forming an opening in the mask layer includes extending the opening into the hard mask layer.

6. The method of claim 1, wherein the step of non-conformally depositing a first film material in the opening, results in an indent in a topmost surface of the first film material, and further wherein the step of forming a second film material over the first film material fills the indent.

7. The method of claim 6, wherein after the step of removing at least a portion of the second film material, a portion of the first film material over the mask layer, and the mask layer, remaining second film material is constrained to within the indent.

8. A method of forming a semiconductor device, the method comprising:
   depositing a top mask layer on a hard mask, the hard mask overlying a patterned layer, the patterned layer having formed therein a trench, the trench extending along a first longitudinal axis when viewed from a top-down perspective;
   forming an opening in the top mask layer, the opening, when viewed from a top-down perspective, extending along a second longitudinal axis perpendicular to the first longitudinal axis;
   forming a first film material over the top mask layer, the first film material filling the opening;
   removing a portion of the first film material over the top mask layer, and the top mask layer; and
   patterning the hard mask using the remaining portion of the first film material as a mask.

9. The method of claim 8, wherein the patterned layer overlies a to-be-patterned layer, and further comprising patterning the to-be-patterned layer using the remaining portion of the first film material as a mask.

10. The method of claim 8, wherein after the step of removing a portion of the first film material, the remaining portion of the first film material lines a sidewall of the trench.

11. The method of claim 8, wherein the step of forming a first film material over the top mask layer, comprises non-conformally depositing the first film material in the opening.

12. The method of claim 8, wherein the step of forming a first film material over the top mask layer includes performing a plasma treatment on the first film material.

13. The method of claim 8, wherein the step of forming the first film material over the top mask layer forms a first indentation in the first film material centered over the opening.

14. The method of claim 8, further comprising forming a second film material over the first film material, the second film material having a high etch selectivity with the first film material.

15. The method of claim 14, wherein the second film material is deposited conformally over the first film material.

16. The method of claim 14, further comprising removing at least a portion of the second film material.

17. A method of forming a semiconductor device, the method comprising:
   forming a first layer over a substrate;
   depositing a hard mask over the first layer;
   forming a photomask layer over the hard mask;
   patterning a plurality of openings in the photomask layer;
   depositing a first film material over the photomask layer, the first film material filling the plurality of openings;
   performing a plasma treatment on the first film material;
   removing the photomask layer and a portion of the first film material (over the photomask layer;
   patterning the hard mask using the remaining portion of the first film material as a mask; and
   patterning the first layer using the patterned hard mask as a mask.

18. The method of claim 17, further comprising:
   depositing a second film material over the first film material, the second film material having a high etch selectivity with the first film material; and
   removing at least a portion of the second film material.

19. The method of claim 18, wherein the second film material overfills a seam in the first film material when deposited, and the remaining portion of the second film material remains only in the seam after the step of removing at least a portion of the second film material.

20. The method of claim 17, wherein:
the respective openings each has a longitudinal axis extending in a first direction; and
at least one layer between the first layer and the hard mask has a plurality of trenches therein, the respective trenches each has a longitudinal axis extending in a second direction perpendicular to the first direction.

\* \* \* \* \*